United States Patent [19]
Kim et al.

[11] Patent Number: 6,148,426
[45] Date of Patent: Nov. 14, 2000

[54] APPARATUS AND METHOD FOR GENERATING ADDRESSES IN A SRAM BUILT-IN SELF TEST CIRCUIT USING A SINGLE-DIRECTION COUNTER

[75] Inventors: Heon-cheol Kim, Yongin; Hong-shin Jun, Seoul, both of Rep. of Korea

[73] Assignee: Samsung Electronics Co., LTD, Rep. of Korea

[21] Appl. No.: 09/067,671

[22] Filed: Apr. 28, 1998

[30] Foreign Application Priority Data

Jul. 25, 1997 [KR] Rep. of Korea ............... 97-35208

[51] Int. Cl.[7] .................................................. G01R 31/28
[52] U.S. Cl. .......................... 714/733; 714/730; 714/743
[58] Field of Search ..................................... 714/733, 734, 714/730, 724, 742, 743, 718, 719, 735, 736, 737; 711/200; 365/201, 200; 324/73.1

[56] References Cited

U.S. PATENT DOCUMENTS

| | | | |
|---|---|---|---|
| 3,801,964 | 4/1974 | Palfi et al. | 340/173 R |
| 4,700,228 | 10/1987 | Heerah | 358/160 |
| 4,872,168 | 10/1989 | Aadsen et al. | 714/718 |
| 5,269,012 | 12/1993 | Nakajima | 711/200 |
| 5,420,870 | 5/1995 | Kim | 714/743 |
| 5,818,772 | 10/1998 | Kuge | 365/201 |

FOREIGN PATENT DOCUMENTS 60-205591 10/1985 Japan .

Primary Examiner—Hoa T. Nguyen
Attorney, Agent, or Firm—Samuels, Gauthier & Stevens LLP

[57] ABSTRACT

A memory address generator having a small chip area, a method for generating a memory address and a SRAM built-in self test (BIST) circuit using the same are described. When the number of addresses of a memory to be tested is $2^n$, where n is the number of bits in an address, the address generator includes an up counter for generating a first address of a series of sequentially increasing addresses, and an inverter for inverting the first address to generate a second address of a series of sequentially decreasing addresses. The address generator also includes a selector for selecting one of the first and second addresses, in response to a control signal, to output the selected address as an address of the memory. When the number of addresses of the memory to be tested is not $2^n$, the address generator includes an up counter for generating a first address of a series of sequentially increasing addresses up to a maximum address of the memory and a subtracter for subtracting the first address from the maximum address to generate a second address of a series of sequentially decreasing addresses. The address generator also includes a selector for selecting one of the first and second addresses, in response to control signal, to output the selected address as an address of the memory.

20 Claims, 1 Drawing Sheet

APPARATUS AND METHOD FOR GENERATING ADDRESSES IN A SRAM BUILT-IN SELF TEST CIRCUIT USING A SINGLE-DIRECTION COUNTER

BACKGROUND OF THE INVENTION

1. Field of the Invention

The present invention relates to a SRAM built-in self test (SRAM BIST) circuit, and more particularly, to an address generator and a method of generating an address and an SRAM BIST using the same.

2. Description of the Related Art

In general, as semiconductor devices become more complicated and highly integrated, research is underway on various methods for effectively testing the semiconductor devices. In particular, memory built-in self test (BIST) methods have been developed for effectively testing a memory in a semiconductor device using a BIST circuit implemented in connection with memory test processes.

A SRAM BIST circuit typically includes a BIST controller for controlling BIST operation, a data generator for generating data to be written to the SRAM, an address generator for generating an address for the SRAM, a comparator for comparing data read from the SRAM, and a counter for counting steps of the test process. A typical address generator performs both up counting and down counting according to the test procedure. However, when the address generator is produced using such an up/down counter, there are difficulties in obtaining an optimized chip area. For example, when the number of addresses in the SRAM to be tested is $2^n$, where n is the number of bits in a SRAM memory address, the address generator can be readily realized using the up/down counter; however, the chip area of the address generator is relatively large. When the number of addresses in the SRAM to be tested is not $2^n$ and the address generator is realized using the up/down counter, other additional circuitry which interfaces with the up/down counter is required, and the chip area of the address generator becomes even larger.

SUMMARY OF THE INVENTION

It is a first object of the present invention to provide an address generator occupying a small chip area in a SRAM BIST circuit.

It is a second object of the present invention to provide a SRAM BIST circuit using the address generator of the invention.

It is a third object of the present invention to provide a method for effectively generating an address in a SRAM BIST circuit.

In one embodiment, the SRAM BIST circuit of the invention includes a BIST controller, a data generator, an address generator, a comparator and a counter. The BIST controller generates control signals according to the test process being used and controls the overall BIST circuit operation. The data generator is controlled by the BIST controller and generates data to be written in the memory being tested as well as comparison data for comparison to data read from the memory. The address generator is controlled by the BIST controller to generate an address of the memory according to the test process. The comparator is controlled by the BIST controller and compares the comparison data to the data read from the memory. The counter is controlled by the BIST controller to count the steps of the procedure being performed.

When the number of addresses of a memory to be tested is $2^n$, where n is the number of bits in a memory address, the address generator of a SRAM BIST circuit in accordance with the invention can include an up counter for generating a first series of sequentially increasing addresses and an inverter for inverting the first series of addresses to generate a second series of sequentially decreasing addresses. The address generator of the invention in the SRAM BIST circuit of the invention can also include a selector for selecting one or more addresses from the first and/or second series of addresses, in response to an up/down control signal generated by the BIST controller, to output the selected address as a test address of the memory to be tested.

When the number of addresses of the memory to be tested is not $2^n$, an address generator of an SRAM BIST circuit in accordance with another aspect of the invention can include an up counter for generating a first series of sequentially increasing addresses up to a maximum address of the memory to be tested and a subtracter for subtracting one or more addresses of the first series of addresses from the maximum address to generate a second series of sequentially decreasing addresses. Also, the address generator of the SRAM BIST circuit of this aspect of the invention further includes a selector for selecting one or more addresses from the first and/or second series of addresses, in response to an up/down control signal generated by the BIST controller, to output the selected address a test address of the memory to be tested.

Also, when the number of addresses of the memory to be tested is $2^n$, a method in accordance with the invention for generating an address of the SRAM BIST circuit for accomplishing the third object includes the steps of generating a first series of sequentially increasing addresses and inverting one or more of the first series of addresses to generate a second series of sequentially decreasing addresses. The method for generating an address of the SRAM BIST circuit can also include the step of selecting one or more of the addresses from the first and/or second series of addresses to output the selected address as a test address of the memory to be tested.

When the number of addresses of the memory to be tested is not $2^n$, an alternative method in accordance with the invention for generating an address of the SRAM BIST circuit for accomplishing the third object includes the steps of generating a first series of sequentially increasing addresses up to a maximum address of a memory to be tested and subtracting one or more addresses of the first series of addresses from the maximum address to generate a second series of sequentially decreasing addresses. The method for generating an address of the SRAM BIST circuit for accomplishing the third object can also include the step of selecting one or more addresses from the first and/or second series of addresses, to output the selected address as an address of the memory to be tested.

Hence, the address generator and BIST circuit of the invention can provide advantages over other such devices. Because the address generator of the invention can use only a single up counter to generate addresses, overall circuit size and complexity can be reduced. Also, the supporting and controlling circuitry can be smaller and less complex, resulting in further savings in size, complexity and cost.

BRIEF DESCRIPTION OF THE DRAWINGS

The above objects and advantages of the present invention will become more apparent from the following detailed description of preferred embodiments thereof with reference to the attached drawings in which.

DESCRIPTION OF THE PREFERRED EMBODIMENTS

Figure 1:
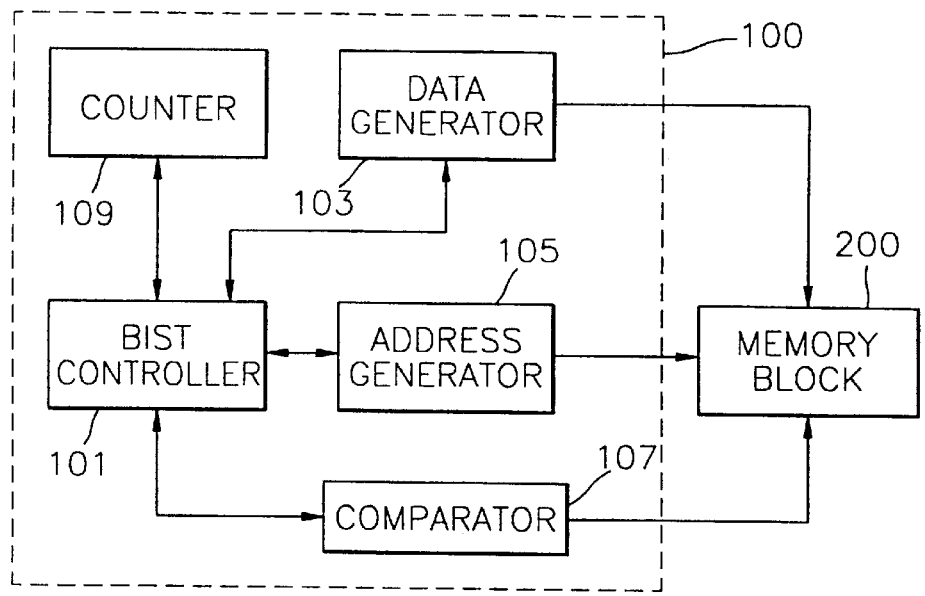
FIG. 1 is a schematic block diagram of a SRAM BIST circuit in accordance with the present invention.

Referring to FIG. 1, a SRAM BIST circuit 100 in accordance with the invention used to test a memory block 200 such as a SRAM includes a BIST controller 101, a data generator 103, an address generator 105, a comparator 107 and a counter 109. The BIST controller 101 controls the operation of the BIST circuit 100 and generates control signals according to the memory test method being implemented. The data generator 103 is controlled by the BIST controller 101 to generate data to be written to the memory block 200 under test (i.e., the SRAM) and to also generate comparison data. During test, the comparison data is compared to data written to an addressed location of the memory block 200 to determine whether data can successfully be written to and read from the memory 200. The address generator 105 is controlled by the BIST controller 101 to generate the addresses of the locations of the memory block 200 being tested according to the test process of the invention. The comparator 107 is controlled by the BIST controller 101 to compare data read from the memory block 200 to the comparison data generated by the data generator. The counter 109 is controlled by the BIST controller 101 and counts steps of the test process.

The address generator 105 of the SRAM BIST circuit 100 performs up- and down-counting according to the memory test procedure. In prior systems, the address generator of a BIST circuit is designed using one up/down counter or separate up and down counters. The result is that chip area increases. Accordingly, in the present invention, an address generator 105 having a relatively small chip area and an SRAM BIST circuit 100 using the address generator 105 are provided.

Figure 2:
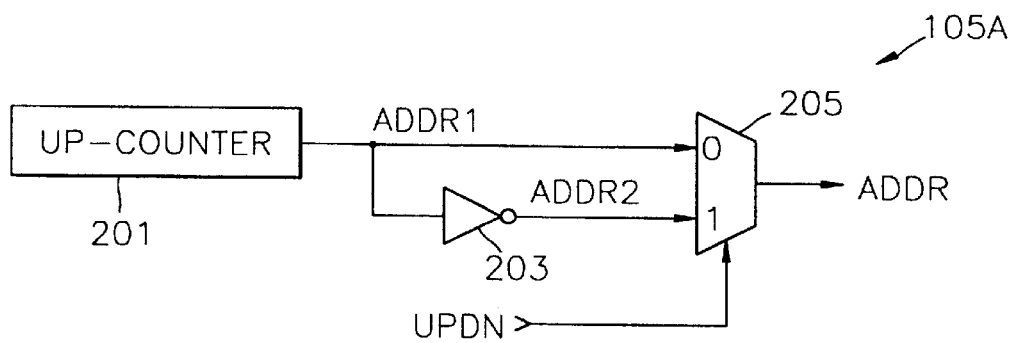
FIG. 2 is a schematic block diagram of one embodiment of an address generator according to the present invention.

FIG. 2 is a schematic block diagram of one embodiment of the address generator 105A according to the present invention. The embodiment of FIG. 2 is employed when the number of addresses of the memory block 200 of FIG. 1 is $2^n$. The address generator 105A generates the addresses of the memory block according to a method for generating an address of the present invention.

Referring to FIG. 2, the address generator 105A includes one up counter 201, an inverter 203, and a selector 205. The up counter 201 generates a first address ADDR1 of a sequentially increasing series of addresses. The inverter 203 inverts the first address ADDR1 to generate a second address ADDR2 of a second sequentially decreasing series of addresses. The selector 205 selects one from the first and second addresses ADDR1 and ADDR2, in response to the up/down control signal UPDN, to output the selected address as an address ADDR applied to the memory block 200 of FIG. 1 to test the location of the memory block 200 addressed by the address ADDR.

In one embodiment, the selector 205 includes a multiplexer and selects the first address ADDR1 as the address ADDR when the up/down control signal UPDN is logic low and the second address ADDR2 as the address ADDR when the up/down control signal UPDN is logic high. The up/down control signal UPDN is generated by the BIST controller 101 of FIG. 1 and has a state determined by a value of a current method step generated by the counter 109.

Table 1 shows addresses generated by the address generator 105A of FIG. 2. As shown in Table 1, the uninverted addresses ADDR1 are counted in ascending or sequentially increasing order. The inverted versions of the ADDR1 addresses, labeled ADDR2, are shown in descending or sequentially decreasing order. As shown in Table 1, the one of the addresses ADDR1 and ADDR2 that is output from the address generator 105A as the address ADDR is determined by the state of the control signal UPDN. When UPDN=0, the address ADDR1 is selected to be provided as the output address ADDR, such that the memory can be tested by ascending addresses. When UPDN=1, the address ADDR2 is selected to be provided as the output address ADDR, such that the memory can be tested by descending addresses.

TABLE 1

|  |  | ADDR | |
| --- | --- | --- | --- |
| ADDR1 | ADDR2 | UPDN = 0 | UPDN = 1 |
| 00000000 | 11111111 | 00000000 | 11111111 |
| 00000001 | 11111110 | 00000001 | 11111110 |
| . | . | . | . |
| . | . | . | . |
| 11111110 | 00000001 | 11111110 | 00000001 |
| 11111111 | 00000000 | 11111111 | 00000000 |

Figure 3:
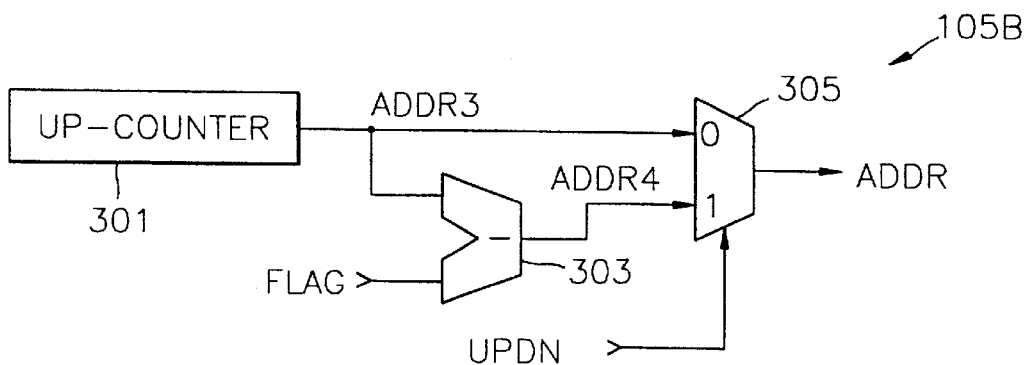
FIG. 3 is a schematic block diagram of an alternative embodiment of an address generator according to the present invention.

FIG. 3 contains a schematic block diagram of another embodiment 105B of an address generator in accordance with the invention. The address generator 105B of FIG. 3 is employed when the number of addresses of the memory block 200 of FIG. 1 is not $2^n$. This embodiment of the address generator 105B uses an approach to generating addresses different than that used by the address generator 105A described above.

Referring to FIG. 3, the address generator 105B includes one up counter 301, a subtracter circuit 303 and a selector 305. The up counter 301 generates a first address ADDR3 of a sequentially increasing series of addresses to a maximum address of the memory to be tested, i.e., the memory block 200. The subtracter 303 subtracts the first address ADDR3 from a flag value FLAG identical to the maximum address, to generate a second address ADDR4 of a sequentially decreasing series of addresses. The selector 305 selects one from the first and second addresses ADDR3 and ADDR4, in response to the up/down control signal UPDN, to output the selected address as an address ADDR applied to the memory block 200 of FIG. 1 to test the location of the memory block 200 addressed by the address ADDR.

In one embodiment, the selector 305 includes a multiplexer and selects the first address ADDR3 as the address ADDR when the up/down control signal UPDN is logic low and selects the second address ADDR4 as the address ADDR when the up/down control signal UPDN is logic high. The up/down control signal UPDN is generated by the BIST controller 101 of FIG. 1, and has a state determined by the value of a current method step generated by the counter 109.

Table 2 shows addresses generated by the address generator 105B of FIG. 3. As shown in Table 2, the addresses ADDR3 generated by the up counter 301 are counted in ascending or sequentially increasing order. Each address ADDR4 is generated by subtracting an address ADDR3 from the FLAG value set to the maximum memory address, which in the illustration is set to a value of $9F_H$. As a result, a set of descending or sequentially decreasing addresses ADDR4 is produced. As shown in Table 2, the one of the addresses ADDR3 and ADDR4 that is output from the address generator 105B as the address ADDR is determined by the state of the control signal UPDN. When UPDN=0, the address ADDR3 is selected to be provided as the output address ADDR, such that the memory can be tested by ascending addresses. When UPDN=1, the address ADDR4 is selected to be provided as the output address ADDR, such that the memory can be tested by descending addresses.

TABLE 2

| | | | ADDR | |
|---|---|---|---|---|
| ADDR3 | ADDR4 | FLAG | UPDN = 0 | UPDN = 1 |
| 00000000 | 10011111 | 10011111 | 00000000 | 10011111 |
| 00000001 | 10011110 | 10011111 | 00000001 | 10011110 |
| . | . | . | . | . |
| . | . | . | . | . |
| . | . | . | . | . |
| 10011110 | 00000001 | 10011111 | 10011110 | 00000001 |
| 10011111 | 00000000 | 10011111 | 10011111 | 00000000 |

While this invention has been particularly shown and described with references to preferred embodiments thereof, it will be understood by those skilled in the art that various changes in form and details may be made therein without departing from the spirit and scope of the invention as defined in the following claims.

What is claimed is:

1. An address generator of a memory built-in self test (BIST) circuit comprising:
   an up counter for generating a series of sequentially increasing addresses;
   an inverter for inverting addresses of the series of sequentially increasing addresses to generate a series of sequentially decreasing addresses; and
   a selector for selecting one of (i) an address from the series of sequentially increasing addresses and (ii) an address from the series of sequentially decreasing addresses, in response to a control signal, to output the selected address as an address of a memory to be tested.

2. The address generator of claim 1, wherein the selector selects an address from the series of sequentially increasing addresses when the control signal is in a first logic state and selects an address from the series of sequentially decreasing addresses when the control signal is in a second logic state.

3. The address generator of claim 1, wherein the selector is a multiplexer.

4. The address generator of claim 1, wherein the number of addresses of the memory is $2^n$, where n is the number of bits of an address.

5. An address generator of a memory BIST circuit comprising:
   an up counter for generating a first address of a first series of sequentially increasing addresses up to a maximum address of a memory to be tested;
   a subtracter for subtracting the first address from the maximum address to generate a second address of a second series of sequentially decreasing addresses; and
   a selector for selecting one from the first and second addresses, in response to a control signal, to output the selected address as the address of the memory.

6. The address generator of claim 5, wherein the selector selects the first address when the control signal is in a first logic state and selects the second address when the control signal is in a second logic state.

7. The address generator of claim 5, wherein the selector is a multiplexer.

8. The address generator of claim 5, wherein the number of addresses of the memory is not $2^n$, where n is the number of bits of an address.

9. A memory built-in self test (BIST) circuit for testing a memory in a semiconductor device, comprising:
   a BIST controller for generating control signals according to a test being performed on the memory to control the BIST operation;
   a data generator controlled by the BIST controller for generating data to be written to the memory and comparison data for comparing to data read from the memory;
   a comparator controlled by the BIST controller for comparing the comparison data with the data read from the memory;
   a counter controlled by the BIST controller for counting steps of the test being performed; and
   an address generator controlled by the BIST controller for generating the address of the memory according to the test being performed, said address generator comprising:
      an up counter for generating a first address of a first series of sequentially increasing addresses;
      an inverter for inverting the first address to generate a second address of a second series of sequentially decreasing addresses; and
      a selector for selecting one from the first and second addresses, in response to an up/down control signal generated by the BIST controller, to output the selected address as an address of the memory.

10. The memory BIST circuit of claim 9, wherein the selector selects the first address when the up/down control signal is in a first logic state and selects the second address when the up/down control signal is in a second logic state.

11. The memory BIST circuit of claim 9, wherein the selector is a multiplexer.

12. The memory BIST circuit of claim 9, wherein the number of addresses of the memory is $2^n$, where n is the number of bits of an address.

13. A memory built-in self test (BIST) circuit for testing a memory in a semiconductor device, comprising:
   a BIST controller for generating control signals according to a test being performed on the memory to control the BIST operation;
   a data generator controlled by the BIST controller for generating data to be written to the memory and comparison data for comparing to data read from the memory;
   a comparator controlled by the BIST controller for comparing the comparison data with the data read from the memory;
   a counter controlled by the BIST controller for counting steps of the test being performed; and
   an address generator controlled by the BIST controller for generating the address of the memory according to the test being performed, said address generator comprising:
      an up counter for generating a first address of a first series of sequentially increasing addresses up to a maximum address of the memory;
      a subtracter for subtracting the first address from the maximum address to generate a second address of a second series of sequentially decreasing addresses; and a selector for selecting one from the first and second addresses, in response to an up/down control signal generated by the BIST controller, to output the selected address as an address of the memory.

14. The memory BIST circuit of claim 13, wherein the selector selects the first address when the up/down control signal is in a first logic state and selects the second address when the up/down control signal is in a second logic state.

15. The memory BIST circuit of claim 13, wherein the selector is a multiplexer.

16. The memory BIST circuit of claim 13, wherein the number of addresses of the memory is not $2^n$, where n is the number of bits of an address.

17. A method for generating an address in a memory BIST circuit comprising:

a) generating a series of sequentially increasing addresses;

b) inverting addresses of the series of sequentially increasing addresses to generate a series of sequentially decreasing addresses; and c) selecting one of (i) an address from the series of sequentially increasing addresses and (ii) an address from the series of sequentially decreasing addresses to output the selected address as the address of the memory to be tested.

18. The method for generating an address of claim 17, wherein the number of addresses of the memory is $2n$, where n is the number of bits of an address.

19. A method for generating an address in a memory BIST circuit comprising:

a) generating a first address of a first series of sequentially increasing addresses up to a maximum address of a memory to be tested;

b) subtracting the first address from the maximum address to generate a second address of a second series of sequentially decreasing addresses; and c) selecting one from the first and second addresses to output the selected address as an address of the memory.

20. The method for generating an address of claim 19, wherein the number of addresses of the memory is not $2^n$, where n is the number of bits of an address.

* * * * *